United States Patent
Fazakas

(10) Patent No.: US 6,891,354 B2
(45) Date of Patent: May 10, 2005

(54) METHOD FOR DETECTING SLOW AND SMALL CHANGES OF ELECTRICAL SIGNALS

(76) Inventor: András Fazakas, Behczur 39/B, Budapest (HU), 1068

( * ) Notice: Subject to any disclaimer, the term of this patent is extended or adjusted under 35 U.S.C. 154(b) by 0 days.

(21) Appl. No.: 10/666,492

(22) Filed: Sep. 19, 2003

(65) Prior Publication Data

US 2004/0150370 A1 Aug. 5, 2004

Related U.S. Application Data

(63) Continuation-in-part of application No. 10/031,106, filed as application No. PCT/HU00/00071 on Jul. 3, 2000, now Pat. No. 6,628,125, and a continuation-in-part of application No. 10/031,103, filed as application No. PCT/HU00/00073 on Jul. 3, 2000.

(30) Foreign Application Priority Data

Jul. 15, 1999 (HU) .............................................. 9902384

(51) Int. Cl.[7] ................................................ H02J 7/00
(52) U.S. Cl. ..................................................... 320/137
(58) Field of Search ................................ 320/137, 136, 320/157; 324/426–429

(56) References Cited

U.S. PATENT DOCUMENTS

| | | | |
|---|---|---|---|
| 4,137,493 A | 1/1979 | Smith | 320/148 |
| 4,820,965 A * | 4/1989 | Siemer | 320/165 |
| 4,878,007 A | 10/1989 | Gabor et al. | 320/136 |
| 5,270,635 A | 12/1993 | Hoffman et al. | 320/122 |
| 5,451,880 A * | 9/1995 | Yamagishi et al. | 324/429 |
| 5,463,304 A | 10/1995 | Winters | 320/139 |
| 5,519,302 A | 5/1996 | Mino et al. | 320/148 |
| 5,583,871 A | 12/1996 | Simmonds et al. | 320/151 |

(Continued)

FOREIGN PATENT DOCUMENTS

| | | |
|---|---|---|
| DE | 101988 | 11/1973 |
| DE | 5410238 | 4/1995 |
| DE | 4446535 | 6/1996 |
| DE | 5864224 | 1/1999 |
| DE | 611 224 | 9/2000 |

(Continued)

*Primary Examiner*—Pia Tibbits
(74) *Attorney, Agent, or Firm*—Kirkpatrick & Lockhart Nicholson Graham LLP; Anthony H. Handal

(57) ABSTRACT

Apparatus for detecting slow and small changes of electrical signals including the sign of the changes, which has:
  a controlled switch (2) connected in the path of the signal to be detected;
  a capacitor (3) connected with a first terminal to the switch and charged to the voltage of the signal;
  an amplifier (5) with an input connected to second terminal of the capacitor (3) and generating a pulse signal corresponding to the charge or discharge current of the capacitor having corresponding proper sign;
  a window comparator (7) having first and second reference voltages (+UK, -UK) determining a window, and a signal input connected to output of the amplifier (5) for indicating whether the output signal of the amplifier lies in the range defined by the window or it has been crossed in negative or positive directions;
  storage and logical units each having first and second storage means (8, 11); and
  a pulse generator (9) connected to control input of the controlled switch (2) to make it closed for periodically repeated sampling periods, and also connected to the storage and logical units,
wherein the first storage means storing the logical state of the window comparator (7) taken during the pulse signal with proper sign, and a predetermined section of each pulse of the pulse generator reading such stored values of the first storage means into the second storage means.

11 Claims, 2 Drawing Sheets

U.S. PATENT DOCUMENTS

| | | | |
|---|---|---|---|
| 5,635,820 A | 6/1997 | Park | 320/148 |
| 5,694,022 A | 12/1997 | Ranta et al. | 320/142 |
| 5,796,255 A | 8/1998 | McGovan | 324/429 |
| 6,628,125 B1 | 9/2003 | Fazakas | 324/678 |

FOREIGN PATENT DOCUMENTS

| | | |
|---|---|---|
| EP | 0760532 | 3/1989 |
| GB | 2251346 | 7/1992 |
| GB | 2332280 | 6/1999 |
| WO | WO 9914612 | 3/1999 |

\* cited by examiner

METHOD FOR DETECTING SLOW AND SMALL CHANGES OF ELECTRICAL SIGNALS

CROSS-REFERENCE TO RELATED APPLICATIONS

This application is a continuation-in-part of U.S. patent application Ser. No. 10/031,106 filed Jan. 10, 2002 now U.S. Pat. No. 6,628,125 which is the U.S. national stage of International Patent Application No. PCT/HU00/00071 filed Jul. 3, 2000 and is a continuation-in-part of copending U.S. patent application Ser. No. 10/031,103 filed Jan. 10, 2002 which is the U.S. national stage of International Patent Application No. PCT/HU00/00073 filed Jul. 3, 2000. The entire disclosure of each and every one of the aforementioned United States and International Patent Applications is hereby incorporated herein by reference thereto.

BACKGROUND OF THE INVENTION

The invention relates to a method for detecting slow and small changes of electrical signals including the sign of the changes, to determine the end-of-charge condition of batteries being charged.

Direct current voltages can generally be measured with a required accuracy. There are, however, special tasks of measurements, wherein changes should be exactly detected, which are very low relative to the level of the direct current voltage, e.g. 10-3 or 10-4 times of the DC level, and such changes take place slowly, e.g. during a couple of hours. The difficulty of the task increases if the occurrence of such slow changes should be detected very fast that means less than a couple of minutes, and the detection time might be in the order of magnitude of 10 seconds. In case of such detection tasks conventional methods of measuring voltages cannot be used, since the useful signal is not higher than the accuracy of the measurements.

Typically such a task is the determination of the end-of-charge moment in case of charging batteries. Especially, when the battery is charged intensively with a high charging current, the charging process would be finished as soon as the fully charged state has been reached, otherwise the battery might suffer an irreversible damage.

In the booklet of Motorola Inc. SG 73/D Rev. 17, 1998 of the Master Selection Guide series, an integrated battery charger circuit type MC 33340P is described that can detect the decrease of the battery voltage by a sensitivity of 4 mV. Useful accuracy, for the objectives of the invention, may be much higher than this value, and it may not be sufficient to detect the decrease of the voltage only, it is desirable to determine the tendency of the change as well. Determining the tendency means making a determination as to whether the signal has decreased by a predetermined extent, whether it has increased at least by that extent or whether it has remained unchanged i.e. the fluctuations have not exceeded the predetermined level. The battery voltage starts decreasing after it has reached its maximum. There are several types of batteries, wherein there is no sudden maximum but rather a steady voltage condition through a longer period of time, and the life of the battery gets reduced when it is charged throughout that voltage plateau.

U.S. Pat. No. 4,137,493 describes a detector circuit for detecting changes in the level of a DC voltage used for controlling the end-of-charge moment of a battery charger. In this detector a capacitor is charged in sampling periods to the DC voltage, and in each sampling period if the DC voltage level has changed since the previous period, a charging or discharging current will flow through the lead out wire of the capacitor until it takes the new DC value. This transient current is monitored and compared with a reference voltage. The accuracy of this detector is limited by the non-compensated DC offset of the applied circuitry.

In case of very small changes of voltage signals, prior to the present invention, there was no kind of reliable and accurate means available to detect the steepness of the changes or the persistence of an unchanged state of the signal. The knowledge of such parameters would be, however, desirable in several applications of the invention.

Furthermore, the invention provides a method for determining an end-of-charge moment for a battery being charged, the method comprising the steps of:

periodically sampling an electrical parameter of the battery, said parameter being selected from the group consisting of the battery voltage and the charging current;

determining at each sampling the change in the value of said electrical parameter compared with the value taken in the immediately previous period; and generating an end-of-charge signal when said change in value lies below a predetermined threshold level of change.

BRIEF SUMMARY OF THE INVENTION

One object of the invention is to provide a method that makes possible both the safe detection of the slow and small changes of a direct current voltage and the determination of the tendency of the changes. Other objects lie in providing a method and apparatus which can detect changes that are three decimal orders of magnitude smaller than the DC voltage level.

A further object of the invention is to provide a method that can determine the end-of-charge moment of a battery.

It has been discovered that the end-of-charge state is often indicated by a very low change of the battery voltage which can be below 1 mV or such an indication can be the end of a similarly low decrease of the battery voltage.

According to the invention this condition is met if the slope of change of the charging current $I_{ch}$ or of the battery voltage $U_B$(dU or dI) decreases below a threshold level, and this condition is monitored by a separate voltage or current monitor circuit.

BRIEF DESCRIPTION OF THE SEVERAL VIEWS OF THE DRAWING

The invention will now be described in connection with preferable embodiments thereof, wherein reference will be made to the accompanying drawings. In the drawings.

DETAILED DESCRIPTION OF THE INVENTION

Figures 1, 2:
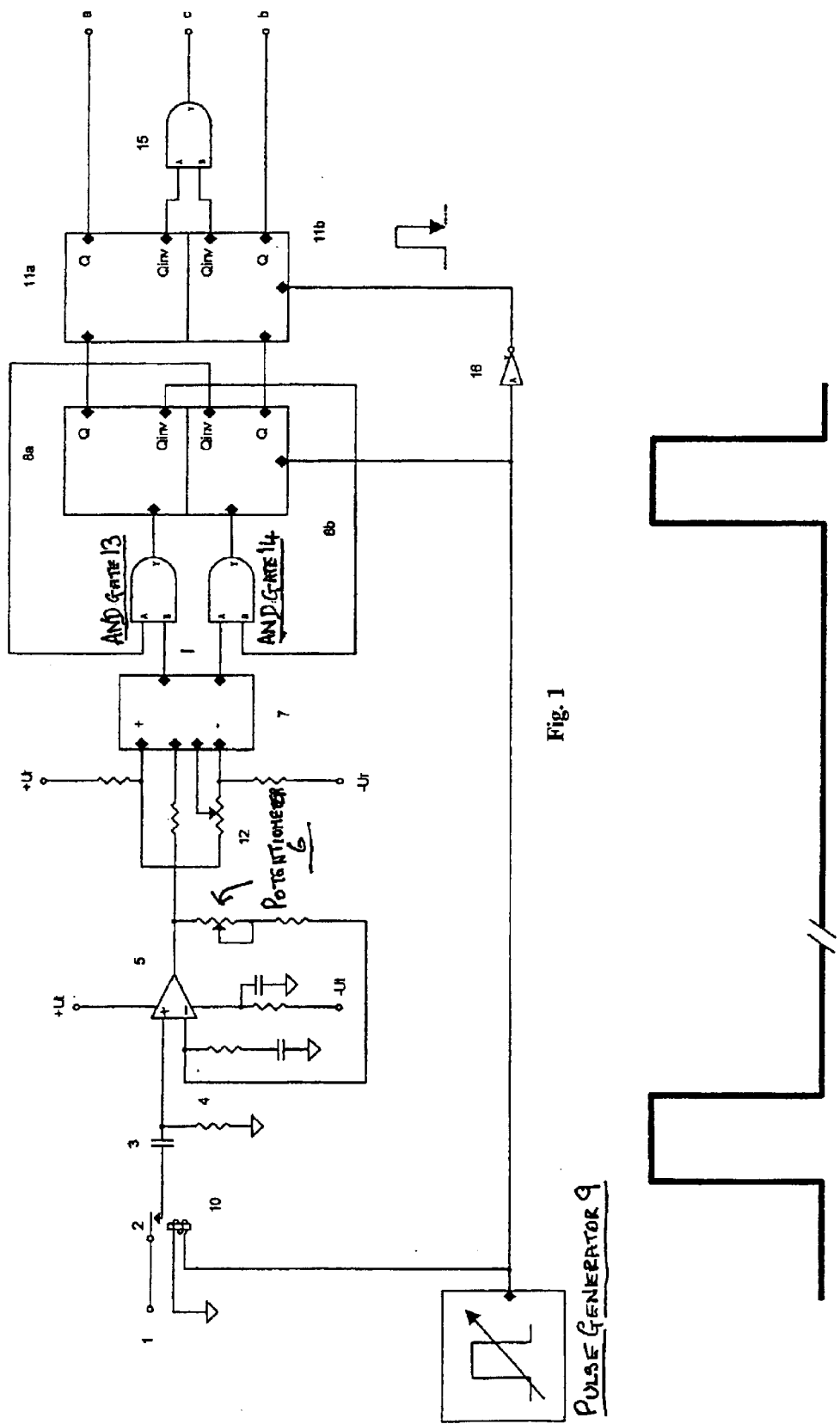
FIG. 1 is a simplified circuit diagram of an exemplary embodiment of the detection circuit according to the invention.
FIG. 2 shows the forms of the pulses of the pulse generator 9.

In the circuit shown in FIG. 1 the signal to be monitored is a direct current voltage of a battery, and its line is coupled to input terminal 1. A controlled switch 2, activated by a contact of relay 10 or by a high quality electronic switch, is connected in series with the input terminal 1. The other wire of the switch 2 is connected to an arm of a capacitor 3 of precision design, and the other arm of capacitor 3 is connected to resistor 4 and to the positive input of a controlled amplifier 5 that comprises a feedback loop. The output of the controlled amplifier 5 is coupled through a branch to its own negative input, whereas the branch comprises a potentiometer 6 and an RC member, also connected to the negative input. The potentiometer 6 is adapted for adjusting the amplification. When a short unipolar voltage pulse is coupled to the positive input of the controlled amplifier 5 and it decays, under the effect of the feedback a half-wave pulse will appear at the output that has an inverse phase relative to the pulse at the input.

The output of the controlled amplifier 5 is connected to signal input of a window comparator 7. The width of the window for comparison can be adjusted, two stabilized voltages +UR and −UR are used for this purpose, and their level can be changed by circuits not shown in FIG. 1. A potentiometer 12 is used to adjust the DC window to be symmetric relative to the DC level at the signal input. The window comparator 7 has two outputs, of which signal will appear on the one, that lies in the direction where the signal voltage has crossed the adjusted voltage limit. The outputs of the window comparator 7 are coupled through respective AND gates 13 and 14 to write inputs of respective bistables 8a and 8b. The second inputs of the AND gates 13, 14 are coupled to the inverted output of the other one of the bistables 8b and 8a, and the use of these gates has a stabilizing effect on the operation.

The common enable input of the bistables 8a and 8b is coupled to output of a pulse generator 9, and this output controls additionally both the relay 10 that has the switch 2 and through an inverter 16 dynamic input of two further bistables 11a and 11b. Write inputs of the bistables 11a and 11b are connected to outputs Q of the two first bistables 8a and 8b. Outputs Q of the two second bistables 11a and 11b constitute outputs a and b of the apparatus. A third output c is connected to output of an AND gate 15 that has inputs coupled to inverted outputs of the second bistables 11a and 11b.

The operation of the voltage detection apparatus according to the invention is as follows:

The monitored device, e.g. a battery is coupled directly to the input terminal 1. The pulse generator 9 generates pulses with predetermined repetition frequency and with given duration. In the exemplary embodiment the duration of the pulses is between about 100 and 500 msec, and the period time of the pulses can be adjusted between about 1 sec and 3 minutes. FIG. 2 shows the shape of the pulses of the pulse generator 9. The same pulses can be seen on FIG. 3a, however, with a different time scale.

For the duration of the pulses the switch 2 is closed and connects the input terminal 1 with the capacitor 3. Before the switch 2 was closed, the voltage on the capacitor 3 was equal with the voltage that prevailed at the input terminal during the end of the previous pulse. This is due to the fact that by the end of the closed state of the switch 2 the capacitor 3 is charged to the voltage present at the input terminal 1. In case if this voltage has changed relative to the value taken during the last pulse, the capacitor 3 will be charged or discharged to this new voltage value, and its charging or discharging current will generate on the resistor 4 a decaying positive or negative voltage pulse.

Figure 3:
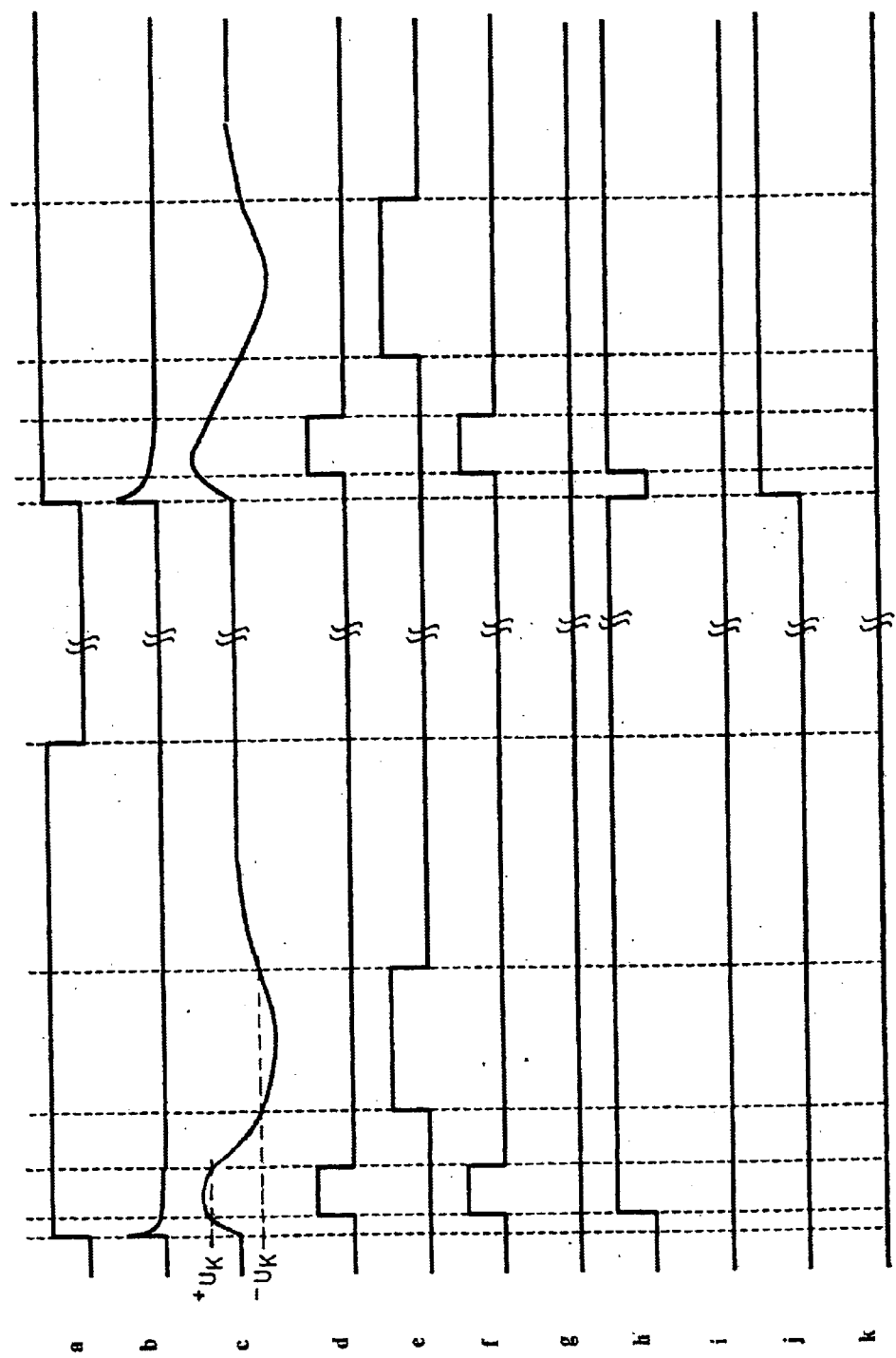
FIGS. 3a to 3k show the time diagrams of the signals that can be measured at a few number of characteristic places of the detection circuit.

If the voltage has increased since the last clock pulse, then the charging current transient will create an output signal that rises in positive direction then decays to zero. This output signal is shown on FIG. 3b. The charging process of the capacitor of the RC member in the feedback branch generates a transient pulse with an opposite sign, and the voltage of the output signal will be as shown in FIG. 3c. The DC average of this output signal will be zero. It is preferable if the time constants of the two subsequently occurring transients are chosen to be almost the same, since that makes the signal comprising the two half waves close to symmetric. The use of the second half wave is significant from the point of view of the long-term stability of the DC component of the output signal. The controlled amplifier 5 has an especially high input impedance, therefore the load represented thereby is negligibly low and it cannot change the voltage of the capacitor 3 within a sampling period.

In case if at the input terminal a decrease of voltage takes place relative to the previous state, then the capacitor 3 will be discharged to the new decreased level. Now the discharge current has an opposite sign with respect to the sign of the charging current at the previous case, thus a negative pulse appears on the resistance 4 with respect to the ground. At the output of the controlled amplifier 5 a full wave voltage pulse appears that starts with a negative half wave.

The duration of the sampling pulse shown on FIG. 2a is longer than the time constant of the RC member consisting of the capacitor 3 and the resistance 4, therefore by the end of the pulse the charging or discharging transient will have finished. When the switch 2 opens, the capacitor 3 will retain its voltage, and owing to its precision design this voltage will be accurately kept till the next pulse. The ratio of the period time and the sampling time is substantially higher than the one deducible from FIG. 2, which has a distorted scale.

As described, the change of the voltage of the input signal in a sampling period causes a voltage wave at the output of the controlled amplifier 5. Depending on the fact whether the input voltage has increased or decreased, this voltage wave starts with a positive or negative half wave. The width of the voltage window of the window comparator 7 is adjusted by the threshold voltages of comparison +UK and −UK to be substantially smaller than the amplitude of this wave. The comparison window should be symmetric to the output DC level of the controlled amplifier 5, and the symmetry can be adjusted by the potentiometer 12. FIG. 3c indicates that the positive threshold of comparison +UK is crossed twice by the voltage lead to the signal input of the comparator 7 in the first half period of the full wave. In accordance with this fact the upper output of the comparator 7 associated with the upper (positive) crossing of the threshold a pulse shown in FIG. 3d will appear. In the second half period the voltage signal will cross twice the lower (negative) threshold of comparison -UK, and at this time a pulse shown in FIG. 3e will appear at the lower comparator output associated with the lower threshold crossings.

The bistables 8a and 8b are reset by the leading 0–1 jump of the clock pulse, thus both of them will have a logical 1 value at their inverted outputs and zero value at the non-inverted outputs. The AND gates 13 and 14 are gated by the inverted output of the other one in the pair of bistables. At the beginning of the clock pulse the inverted output of both bistables 8a and 8b will be in 1 state, the writing into both bistables is possible. In the exemplary case the signal at the input terminal has changed, namely increased, which has a consequence that the wave starts with a positive half period. As a result of this a pulse will first appear at the upper output of the comparator 7 (FIG. 3d), and the value 1 will be written in the bistable 8a. FIG. 3f shows the state of the AND gate 13 and FIG. 3g shows the state of the AND gate 14. FIG. 3h shows the logical value of the bistable 8a, and FIG. 3i shows that of the bistable 8b. When at the output of the controlled amplifier 5 the voltage enters the second half period of the wave signal, and a pulse appears at the lower output of the comparator 7 (FIG. 3e.), no writing will be allowed in the bistable 8b. This is so because the inverted output of the other bistable 8a is in zero state that prohibits passage through the AND gate 14.

At the end of the sampling clock pulse the bistables 11a and 11b react to the rear edge of the pulse and store the momentary states of the other bistables 8a and 8b, and this will be retained till the end of the next period. The bistable 11a will store the "one" state (FIG. 3j) and the bistable 11b will store the "zero" state (FIG. 3k). From this principle it follows that a signal will appear at the output a if at the input terminal the voltage has increased relative to the value taken during the previous sampling pulse. The output b will have a signal if the input voltage has decreased, finally, the output c will have a signal, if the input voltage has not changed, i.e. it has remained within the sensitivity threshold of the apparatus.

The rate of change of the voltage at the input terminal 1 has expedient significance The sensitivity of the measurement of the rate of change can be adjusted within a wide range by means of changing the period time of the sampling pulses. In a given configuration the circuit has a predetermined sensitivity threshold. This can be e.g. 1 mV. Since the period time of the sampling is chosen to 1 minute, then the sensitivity of the rate of change will be 1 mV/min, but in that case the data representing the new states will arrive in 1 minutes periodicity. If the task is constituted by the determination of the end-of-charge moment of a battery, and this condition is related to the fact when the earlier changing battery voltage gets stabilized or constant, then the sensitivity of 1 mV/min is very high. Such a condition can be applied at normal charging tasks. In case of quick chargers the charging current can be so high that the 1 minute interval will prove to be too long between two subsequent sensing, since an overcharging that can last till 1 minute might decrease the lifetime of the battery. In that case the sampling period should be shortened, whereby the sensitivity for the end-of-charge will be smaller, but at the same time the danger of overcharging the battery will practically be eliminated. The fact that the charging process will be finished at a level slightly below the fully charged state has no significance at fast chargers.

The solution according to the invention can thus decide with a high sensitivity and accuracy that the voltage at the input terminal has increased, decreased or has remained unchanged relative to an earlier value. This information has a particular significance in delivering an end-of-charge signal in case of charging batteries.

The circuit shown in FIG. 1 can determine the change of voltage signals only. In several fields of technique there are numerous tasks, in which the change of other characteristics like temperature or current has to be detected. In case if the examined parameter is a voltage or it can be converted to a voltage signal easily, as it is the case at sensing temperature values, the circuit shown in FIG. 1 can be used without any change. In case, however, if the examined characteristics is represented by the peak value of a pulsating signal sequence, the situation will not be easy anymore, because conventional ways of peak detection are associated with offset errors higher than the required sensitivity. Such a peak detection task can be found at such charging processes of batteries in which the change of the charging current should be detected or the moment should be known when the peak values have stabilized.

The charging current is constituted by a pulsating direct current, wherein the pulsation can be converted to a voltage pulse sequence by means of a conventional current-to-voltage converter.

The end-of-charge condition of a battery is often related to a threshold condition in which the change of the battery voltage or current in a given time period drops below a predetermined small value as is described hereinabove. It may happen that, owing to short term noises on the line voltage or sudden changes of the line voltage, the threshold condition can be fulfilled even if the end-of-charge condition is not met. To filter out such disturbing effects it may be useful to monitor the changing battery voltage or current through a small number of sampling periods, and to initiate the end-of-charge condition only if the threshold condition is reached in a majority of these periods. In this way it may be possible to prevent a-single signal noise or random disturbances from affecting the safe determination of the end-of-charge condition.

Disclosures Incorporated. The entire disclosure of each and every United States patent and patent application, of each foreign and international patent publication, of each other publication and of each unpublished patent application that is referenced in this specification or elsewhere in this patent application, is hereby incorporated herein, in its entirety, by the respective specific reference that has been made thereto.

While illustrative embodiments of the invention have been described above, it is, of course, understood that many and various modifications will be apparent to those of ordinary skill in the relevant art, or may become apparent as the art develops. Such modifications are contemplated as being within the spirit and scope of the invention or inventions disclosed in this specification.

What is claimed is:

1. A method for determining an end-of-charge moment for a battery being charged, the method comprising the steps of:
   periodically sampling an electrical parameter of the battery, said parameter being selected from the group consisting of the battery voltage and the charging current;
   determining at each sampling the change in the value of said electrical parameter compared with the value taken in the immediately previous period; and
   generating an end-of-charge signal when said change in value lies below a predetermined threshold level of change.

2. The method as claimed in claim 1, wherein said sampled electrical parameter is the battery voltage and the predetermined threshold level is 1 mv or less than 1 mV.

3. The method as claimed in claim 1, comprising an additional step of changing the time elapsed between two consecutive sampling moments to conform to the battery type and charging method.

4. The method as claimed in claim 1, comprising an additional step of storing said changed values throughout a predetermined number of sampling periods and in said generating step issuing said end-of-charge signal if during said predetermined number of sampling periods the majority of said stored changed values lie below said threshold level.

5. The method as claimed in claim 1, wherein the time elapsed between two subsequent sampling moments is in the range of from a fraction of a minute to a few minutes.

6. The method as claimed in claim 1, comprising smoothing the electrical parameter sample to reduce noise, optionally high frequency noise, in the sample.

7. The method as claim 1, wherein the end-of-charge signal comprises an end-of-charge command for terminating the battery charging process.

8. The method as claimed in claim 7, comprising utilizing the end-of-charge command to terminate the battery charging process before a fully charged state is reached.

9. The method as claimed in claim 1, wherein the detected change in value is at least two orders of magnitude smaller than the value of said electrical parameter.

10. The method as claimed in claim 1, wherein the duration of each sampling is from 100 to 500 msecs.

11. The method as claimed in claim 1 selecting the time elapsed between two consecutive sampling moments to conform to the battery type and appropriate charging method, the elapsed time optionally being in the range of from 1 second to about 3 minutes wherein the detected change in value is at least two orders of magnitude smaller than the value of said electrical parameter, and wherein the end-of-charge signal comprises an end-of-charge command for terminating the battery charging process.

* * * * *